US012598847B2

(12) United States Patent
Yi et al.

(10) Patent No.: US 12,598,847 B2
(45) Date of Patent: Apr. 7, 2026

(54) DISPLAY PANEL AND METHOD OF MANUFACTURING THE SAME

(71) Applicant: Samsung Display Co., Ltd., Yongin-Si (KR)

(72) Inventors: Changho Yi, Seoul (KR); Kyeongwoo Jang, Seoul (KR); Sungho Kim, Suwon-si (KR); Joonhyoung Park, Seongnam-si (KR); Seokje Seong, Seongnam-si (KR); Minwoo Woo, Seoul (KR); Yoon-Jong Cho, Seongnam-si (KR); Hyeri Cho, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 744 days.

(21) Appl. No.: 17/891,441

(22) Filed: Aug. 19, 2022

(65) Prior Publication Data

US 2023/0216002 A1 Jul. 6, 2023

(30) Foreign Application Priority Data

Jan. 3, 2022 (KR) ........................ 10-2022-0000218

(51) Int. Cl.
*H10H 20/857* (2025.01)
*H10H 20/853* (2025.01)
(Continued)

(52) U.S. Cl.
CPC ........ *H10H 20/857* (2025.01); *H10H 20/853* (2025.01); *H10K 50/844* (2023.02);
(Continued)

(58) Field of Classification Search
CPC .. H10K 59/124; H10K 59/123; H10K 59/121; H10K 59/179; H10K 59/131
See application file for complete search history.

(56) References Cited

U.S. PATENT DOCUMENTS

| | | | |
|---|---|---|---|
| 2020/0365674 A1* | 11/2020 | Jeon | .................. H10K 59/1201 |
| 2021/0134932 A1 | 5/2021 | Chae et al. | |

(Continued)

FOREIGN PATENT DOCUMENTS

| | | |
|---|---|---|
| CN | 110278300 A | 9/2019 |
| CN | 111129102 A | 5/2020 |

(Continued)

OTHER PUBLICATIONS

Korean Notice of Allowance corresponding to Application No. 10-2022-0000218 and issued on Sep. 25, 2025, 10 pages.

*Primary Examiner* — Eliseo Ramos Feliciano
*Assistant Examiner* — Adam Joseph Mott
(74) *Attorney, Agent, or Firm* — Innovation Counsel LLP

(57) ABSTRACT

A display panel includes a substrate including adjacently-positioned first display area and second display area, a first inorganic insulation layer on the substrate and defining a transmission part in the second display area, a second inorganic insulation layer disposed on the first inorganic insulation layer and covering an inner surface and a bottom surface of the transmission part, a transparent wire on the second inorganic insulation layer in the second display area a via insulation layer on the second inorganic insulation layer and the transparent wire and including an organic material, a first light emitting element on the via insulation layer in the first display area, a second light emitting element on the via insulation layer in the second display area and electrically connected to the transparent wire, and an encapsulation layer covering the first and the second light emitting elements.

17 Claims, 14 Drawing Sheets

(51) Int. Cl.

| | | |
|---|---|---|
| *H10K 50/844* | (2023.01) | |
| *H10K 59/123* | (2023.01) | |
| *H10K 59/124* | (2023.01) | |
| *H10K 59/131* | (2023.01) | |
| *H10K 59/179* | (2023.01) | |
| *H10H 20/01* | (2025.01) | |
| *H10H 29/14* | (2025.01) | |

(52) U.S. Cl.
CPC ......... *H10K 59/123* (2023.02); *H10K 59/124* (2023.02); *H10K 59/131* (2023.02); *H10K 59/179* (2023.02); *H10H 20/01* (2025.01); *H10H 20/0362* (2025.01); *H10H 20/0364* (2025.01); *H10H 29/142* (2025.01)

(56) References Cited

U.S. PATENT DOCUMENTS

| | | | | |
|---|---|---|---|---|
| 2021/0183983 A1* | 6/2021 | Bang | .................... | H10K 59/121 |
| 2021/0359025 A1* | 11/2021 | Jung | .................... | H10K 50/822 |
| 2021/0391400 A1* | 12/2021 | Kim | .................... | H10K 59/353 |
| 2021/0391407 A1* | 12/2021 | Yoon | .................... | G06F 1/1626 |
| 2022/0115489 A1* | 4/2022 | Park | .................. | H10K 59/1213 |

FOREIGN PATENT DOCUMENTS

| | | | |
|---|---|---|---|
| KR | 10-2020-0131397 A | 11/2020 | |
| KR | 10-2021-0052724 A | 5/2021 | |
| KR | 10-2021-0072953 A | 6/2021 | |
| KR | 10-2021-0077862 A | 6/2021 | |

* cited by examiner

F I G. 4

F I G . 12
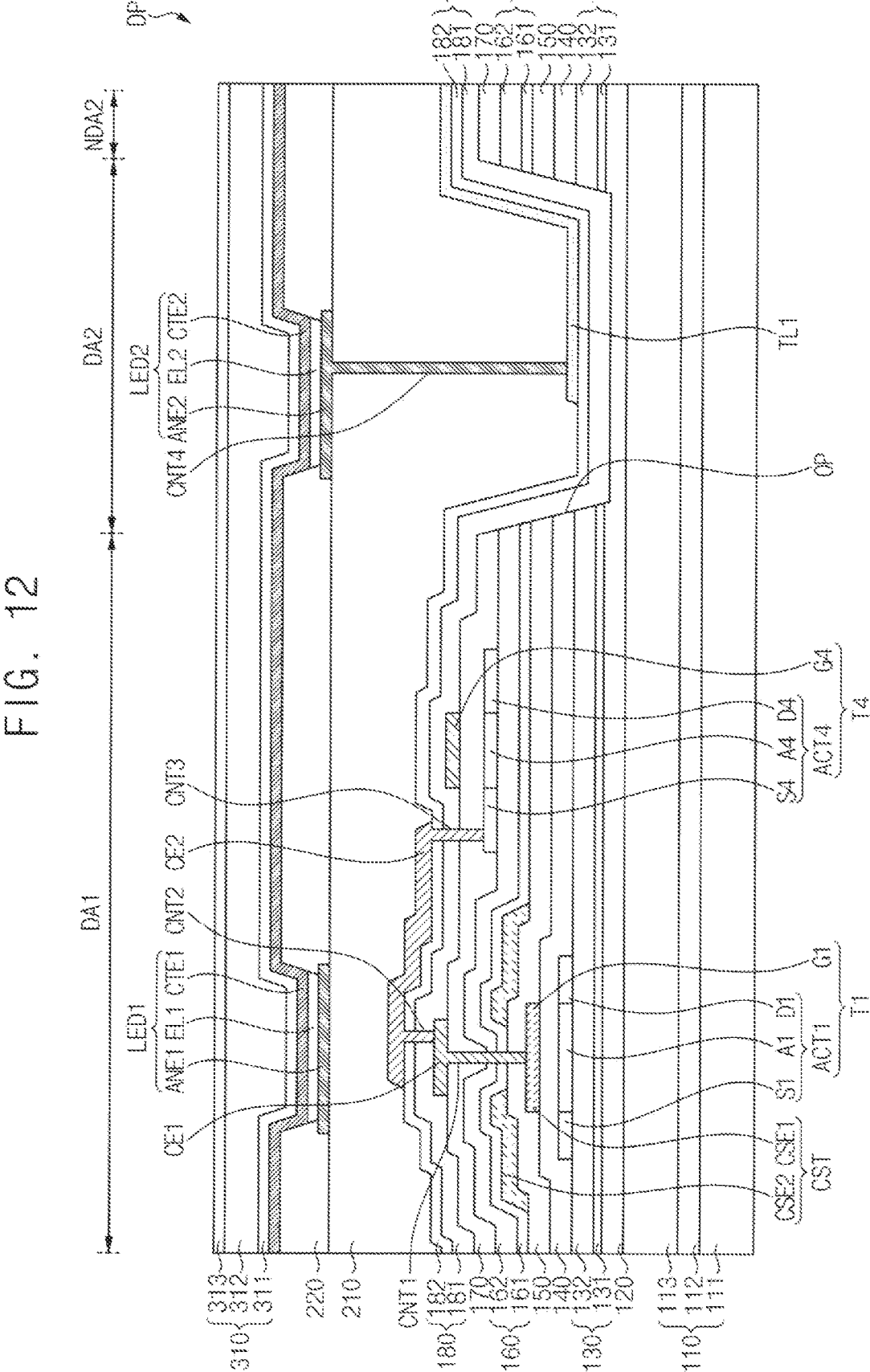

F I G . 13
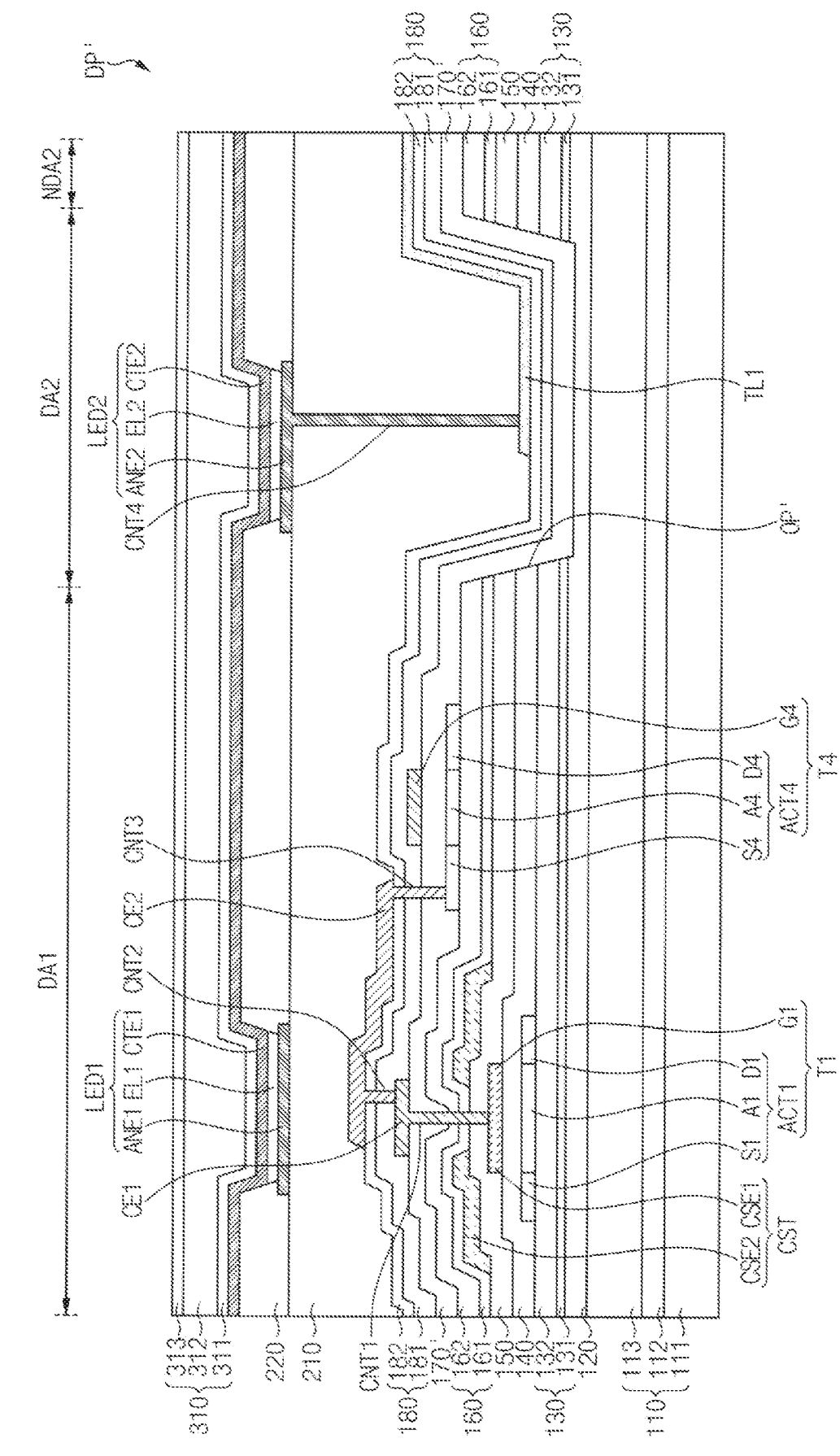

DISPLAY PANEL AND METHOD OF MANUFACTURING THE SAME

This application claims priority to Korean Patent Application No. 10-2022-0000218 filed on Jan. 3, 2022, and all the benefits accruing therefrom under 35 U.S.C. § 119, the content of which is herein incorporated by reference.

BACKGROUND

Field

Implementations of the inventive concept relate generally to a display panel and a method of manufacturing the display panel.

Discussion of the Background

The display panel may provide visual information to a user by converting electrical signals to an image. The display panel may include a transmissive area that transmits light. Through the transmissive area, a functional module, such as a camera module or a sensor module, disposed on the rear surface of the display panel may detect or recognize an object, a user, etc. In order to increase a transmittance of the transmissive area, the display panel may include a transparent wire disposed in the transmissive area.

SUMMARY

Embodiments provide a display panel with improved transmittance distribution of a transmissive area and improved reliability.

Embodiments provide a method of manufacturing the display panel.

A display panel according to an embodiment may include a substrate including a first display area and a second display area adjacent to the first display area, a first inorganic insulation layer disposed on the substrate, and defining a transmission part in the second display area, a second inorganic insulation layer disposed on the first inorganic insulation layer, and covering an inner surface and a bottom surface of the transmission part, a transparent wire disposed on the second inorganic insulation layer in the second display area, and including a transparent conductive material, a via insulation layer disposed on the second inorganic insulation layer and the transparent wire, and including an organic material, a first light emitting element disposed on the via insulation layer in the first display area, a second light emitting element disposed on the via insulation layer in the second display area, and electrically connected to the transparent wire, and an encapsulation layer covering the first light emitting element and the second light emitting element.

In an embodiment, the transparent wire may cover an inner surface of the transmission part.

In an embodiment, the inner surface of the transmission part may include a protrusion part, and the second inorganic insulation layer may cover the protrusion part.

In an embodiment, the second inorganic insulation layer may include silicon nitride.

In an embodiment, the via insulation layer may fill the transmission part.

In an embodiment, the first display area may surround at least a portion of the second display area, and a transmittance of the second display area may be larger than a transmittance of the first display area.

In an embodiment, the display panel may further include a first pixel circuit electrically connected to the first light emitting element, and a second pixel circuit electrically connected to the second light emitting element through the transparent wire.

In an embodiment, the first pixel circuit may include a driving transistor including a first active layer and a first gate electrode disposed on the first active layer, a capacitor including the first gate electrode and a upper electrode disposed on the first gate electrode, and an initialization transistor including a second active layer electrically connected to the first gate electrode, and a second gate electrode disposed on the second active layer.

In an embodiment, the display panel may further include a barrier layer disposed on the substrate, a buffer layer disposed on the barrier layer, a first gate insulation layer covering the first active layer on the buffer layer, a second gate insulation layer covering the first gate electrode on the first gate insulation layer, a first interlayer insulation layer covering the upper electrode on the second gate insulation layer, a third gate insulation layer covering the second active layer on the first interlayer insulation layer, and a second interlayer insulation layer covering the second gate electrode on the third gate insulation layer. The second inorganic insulation layer may include the second interlayer insulation layer In an embodiment, the second inorganic insulation layer may include a first layer including silicon oxide and a second layer including a silicon nitride.

In an embodiment, the first inorganic insulation layer may include the barrier layer, the buffer layer, the first gate insulation layer, the second gate insulation layer, the first interlayer insulation layer, and the third gate insulation layer.

In an embodiment, the first inorganic insulation layer may include the barrier layer, the buffer layer, the first gate insulation layer, the second gate insulation layer, and the first interlayer insulation layer, and the second inorganic insulation layer may further include the third gate insulation layer.

In an embodiment, the barrier layer may define a trench in the second display area and recessed downward from a top surface of the barrier layer, and a bottom surface of the trench may be defined as a bottom surface of the transmission part.

In an embodiment, the display panel may further include a first connection electrode disposed on the same layer as the second gate electrode, and electrically connected to the first gate electrode through a contact hole that extends to the first gate electrode, and a second connection electrode disposed on the second interlayer insulation layer, and electrically connected to each of the first connection electrode and the second active layer.

A display panel according to another embodiment may include a substrate including a first display area and a second display area adjacent to the first display area, a first inorganic insulation layer disposed on the substrate, and defining a transmission part in the second display area, a second inorganic insulation layer disposed on the first inorganic insulation layer, covering an inner surface and a bottom surface of the transmission part, and including silicon nitride, a via insulation layer disposed on the second inorganic insulation layer, filling the transmission part, and including an organic material, a first light emitting element disposed on the via insulation layer in the first display area, a second light emitting element disposed on the via insulation layer in the second display area, and an encapsulation layer covering the first light emitting element and the second light emitting element.

In an embodiment, the display panel may further include a transparent wire disposed on the second inorganic insulation layer in the second display area, and including a transparent conductive material. The second light emitting element may be electrically connected to the transparent wire.

In an embodiment, the transparent wire may cover the inner surface of the transmission part.

A method of manufacturing a display panel according to an embodiment may include forming a first inorganic insulation layer on a substrate including a first display area and a second display area adjacent to the first display area, forming a transmission part corresponding to the second display area by removing a portion of the first inorganic insulation layer, forming a second inorganic insulation layer covering an inner surface and a bottom surface of the transmission part on the first inorganic insulation layer, forming a transparent wire on the second inorganic insulation layer, the transparent wire comprising a transparent conductive material, forming a via insulation layer including an organic material on the second inorganic insulation layer and the transparent wire, forming a first light emitting element and a second light emitting element in the first display area and the second display area on the via insulation layer, wherein the second light emitting element is electrically connected to the transparent wire, and forming an encapsulation layer covering the first light emitting element and the second light emitting element.

In an embodiment, the transparent wire may overlap the inner surface of the transmission part.

In an embodiment, the transmission part may be formed by dry etching the portion of the first inorganic insulation layer, and a protrusion part may be formed on the inner surface of the transmission part by the dry etching. The second inorganic insulation layer may cover the protrusion part.

In an embodiment, the method may further include forming a first pixel circuit electrically connected to the first light emitting element and a second pixel circuit electrically connected to the second light emitting element through the transparent wire on the substrate, before the forming of the via insulation layer. The first pixel circuit may include a driving transistor including a first active layer and a first gate electrode disposed on the first active layer, a capacitor including the first gate electrode and an upper electrode disposed on the first gate electrode, an initialization transistor including a second active layer electrically connected to the first gate electrode and a second gate electrode disposed on the second active layer.

In an embodiment, the forming of the first inorganic insulation layer may include forming a barrier layer on the substrate, forming a buffer layer on the barrier layer, forming a first gate insulation layer covering the first active layer on the buffer layer, forming a second gate insulation layer covering the first gate electrode on the first gate insulation layer, forming a first interlayer insulation layer covering the upper electrode on the second gate insulation layer, and forming a third gate insulation layer covering the second active layer on the first interlayer insulation layer. The forming the second inorganic insulation layer may include forming a second interlayer insulation layer covering the second gate electrode on the third gate insulation layer.

In an embodiment, the method further include forming a contact hole aligned with the first gate electrode by dry etching a portion of each of the second gate insulation layer, the first interlayer insulation layer, and the third gate insulation layer, after the forming of the third gate insulation layer, and forming a first connection electrode electrically connected to the first gate electrode through the contact hole. The forming the contact hole may be performed simultaneously with the forming the transmission part.

In an embodiment, in the dry etching, an etch rate of the first gate electrode may be slower than each of an each rate of the barrier layer, an each rate of the buffer layer, and an etch rate of the first gate insulation layer, and the forming the transmission part may include over-etching the barrier layer, the buffer layer, and the first gate insulation layer.

In an embodiment, the method may further include forming a second connection electrode electrically connected to each of the first connection electrode and the second active layer on the second interlayer insulation layer, after the forming the second interlayer insulation layer. The forming the transparent wire may include forming a transparent conductive layer on the second interlayer insulation layer and the second connection electrode, and forming the transparent wire by wet etching a portion of the transparent conductive layer.

In an embodiment, in the wet etching, an etch rate of the second connection electrode may be smaller than an etch rate of the transparent conductive layer.

In an embodiment, the forming the first inorganic insulation layer may include forming a barrier layer on the substrate, forming a buffer layer on the barrier layer, forming a first gate insulation layer covering the first active layer on the buffer layer, and forming a first interlayer insulation layer covering the upper electrode on the first gate insulation layer. The forming the second inorganic insulation layer may include forming a third gate insulation layer covering the second active layer on the first interlayer insulation layer, and forming a second interlayer insulation layer covering the second gate electrode on the third gate insulation layer.

A display panel according to embodiments may include a substrate including a first display area and a second display area, a first inorganic insulation layer disposed on the substrate and defining a transmission part in the second display area, a second inorganic insulation layer disposed on the first inorganic insulation layer and covering an inner surface of the transmission part, and a transparent wire disposed on the second inorganic insulation layer in the second display area. Accordingly, even if a protrusion part is formed on the inner surface of the transmission part, the disconnection of the transparent wire TL1 may be prevented. Accordingly, a transmittance distribution of the second display area may be improved, and a reliability of the display panel may be improved.

It is to be understood that both the foregoing general description and the following detailed description are examples and are intended to provide further explanation of the inventive concept as claimed.

BRIEF DESCRIPTION OF THE DRAWINGS

The accompanying drawings, which are included to provide a further understanding of the inventive concept and are incorporated in and constitute a part of this specification, illustrate embodiments of the inventive concept together with the description.

FIG. 4 is a cross-sectional view taken along a line I-I' of FIG. 2.

FIG. 6, FIG. 7, FIG. 8, FIG. 9, FIG. 10, FIG. 11, and FIG. 12 are cross-sectional views illustrating a method of manufacturing a display panel of FIG. 4.

FIG. 13 is a cross-sectional view illustrating a display panel according to another embodiment.

DETAILED DESCRIPTION

Illustrative, non-limiting embodiments will be more clearly understood from the following detailed description in conjunction with the accompanying drawings.

Figure 1:
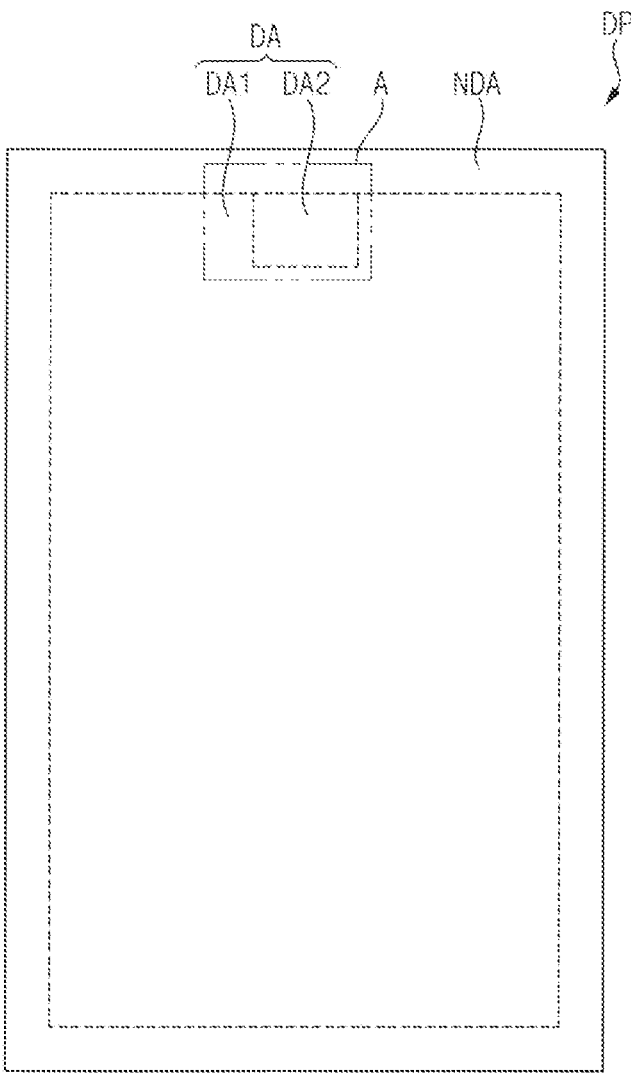
FIG. 1 is a plan view illustrating a display panel according to an embodiment.

FIG. 1 is a plan view illustrating a display panel according to an embodiment.

Referring to FIG. 1, a display panel DP (or, a substrate included in the display panel DP) according to an embodiment may include a display area DA and a non-display area NDA. The non-display area NDA may surround at least a portion of the display area DA.

The display area DA may include a first display area DA1 and a second display area DA2 adjacent to the first display area DA1. The first display area DA1 may surround at least a portion of the second display area DA2.

A functional module, such as a camera module or a sensor module, may be disposed under the second display area DA2 of the display panel DP. A transmittance of the second display area DA2 may be larger than a transmittance of the first display area DA1. For example, the first display area DA1 may not transmit light, and the second display area DA2 may transmit light. The second display area DA2 may be referred to as a transmissive area. Accordingly, the functional module disposed in the second display area DA2 may sense or recognize an object, a user, etc. positioned above the display panel DP.

Figure 2:
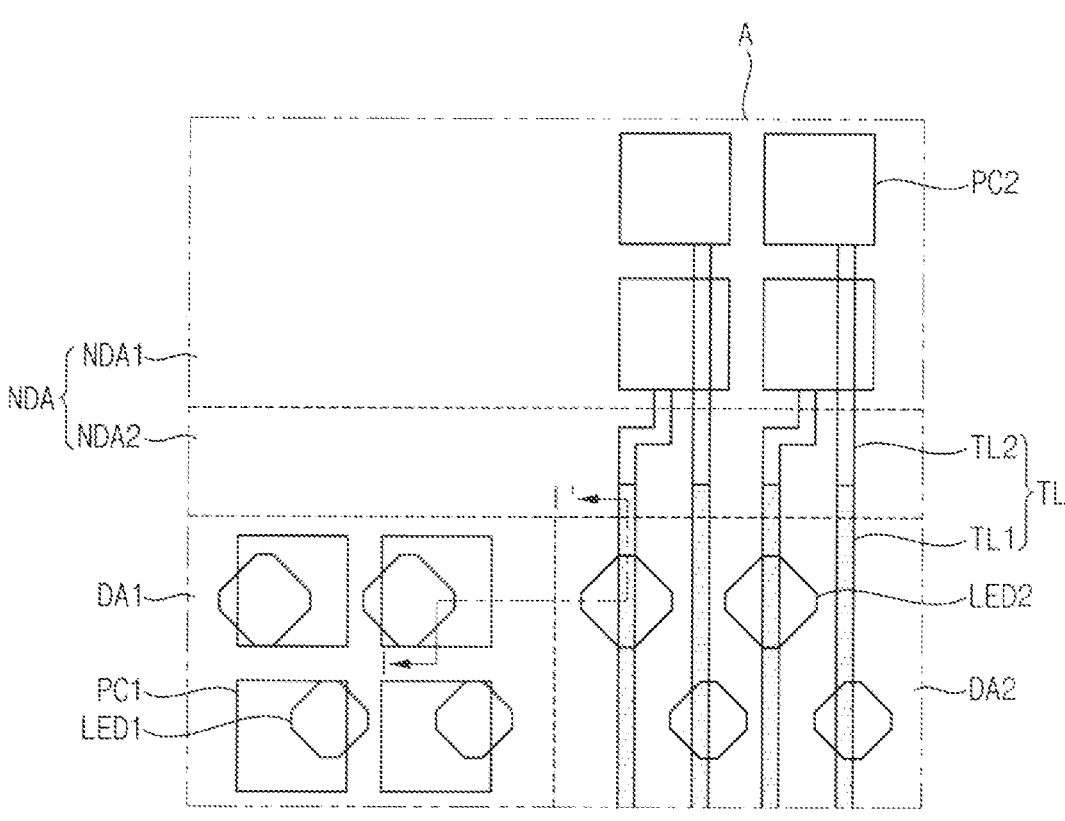
FIG. 2 is a plan view enlarging an area A of FIG. 1.

FIG. 2 is an enlarged plan view of an area A of FIG. 1.

Referring to FIG. 1 and FIG. 2, in an embodiment, the non-display area NDA may include a first non-display area NDA1 and a second non-display area NDA2. The second non-display area NDA2 may be disposed between the second display area DA2 and the first non-display area NDA1.

First light emitting elements LED1 may be disposed in the first display area DA1. In an embodiment, each of the first light emitting elements LED1 may emit at least one of red light, green light, and blue light.

Each of the first light emitting elements LED1 may be electrically connected to each of a first pixel circuits PC1. Each of the first pixel circuits PC1 may provide driving current to each of the first light emitting elements LED1. In an embodiment, the first pixel circuits PC1 may be disposed in the first display area DA1. For example, each of the first pixel circuits PC1 may overlap each of the first light emitting elements LED1.

Second light emitting elements LED2 may be disposed on the second display area DA2. In an embodiment, each of the second light emitting elements LED2 may emit at least one of red light, green light, and blue light. An image may be displayed in the display area DA by combining lights emitted from the first light emitting elements LED1 and the second light emitting elements LED2.

Each of the second light emitting elements LED2 may be electrically connected to each of second pixel circuits PC2. Each of the second pixel circuits PC2 may provide driving current to each of the second light emitting elements LED2. In an embodiment, the second pixel circuits PC2 may be disposed in the first non-display area NDA1. The second light emitting elements LED2 may be electrically connected to the second pixel circuits PC2 through transmission wires TL. In another embodiment, the second pixel circuits PC2 may be disposed on the first display area DA1 or second non-display area NDA2. In still another embodiment, the second pixel circuits PC2 may be disposed on a boundary between the first display area DA1 and the second display area DA2.

In an embodiment, each of the transmission wires TL may include a transparent wire TL1 and a metal wire TL2. Each of the transparent wires TL1 may be connected to a corresponding second light emitting element among the second light emitting elements LED2 disposed in the second display area DA2. Each of the transparent wires TL1 may extend from the corresponding second light emitting element to the second non-display area NDA2. Each of the transparent wires TL1 may be connected to a corresponding metal wire among the metal wires TL2 in the second non-display area NDA2. Each of the metal wires TL2 may be connected to a corresponding second pixel circuit among the second pixel circuit PC2 disposed in the first non-display area NDA1. In another embodiment, transmission wire TL may be entirely formed of the transparent wire TL1.

Figure 3:
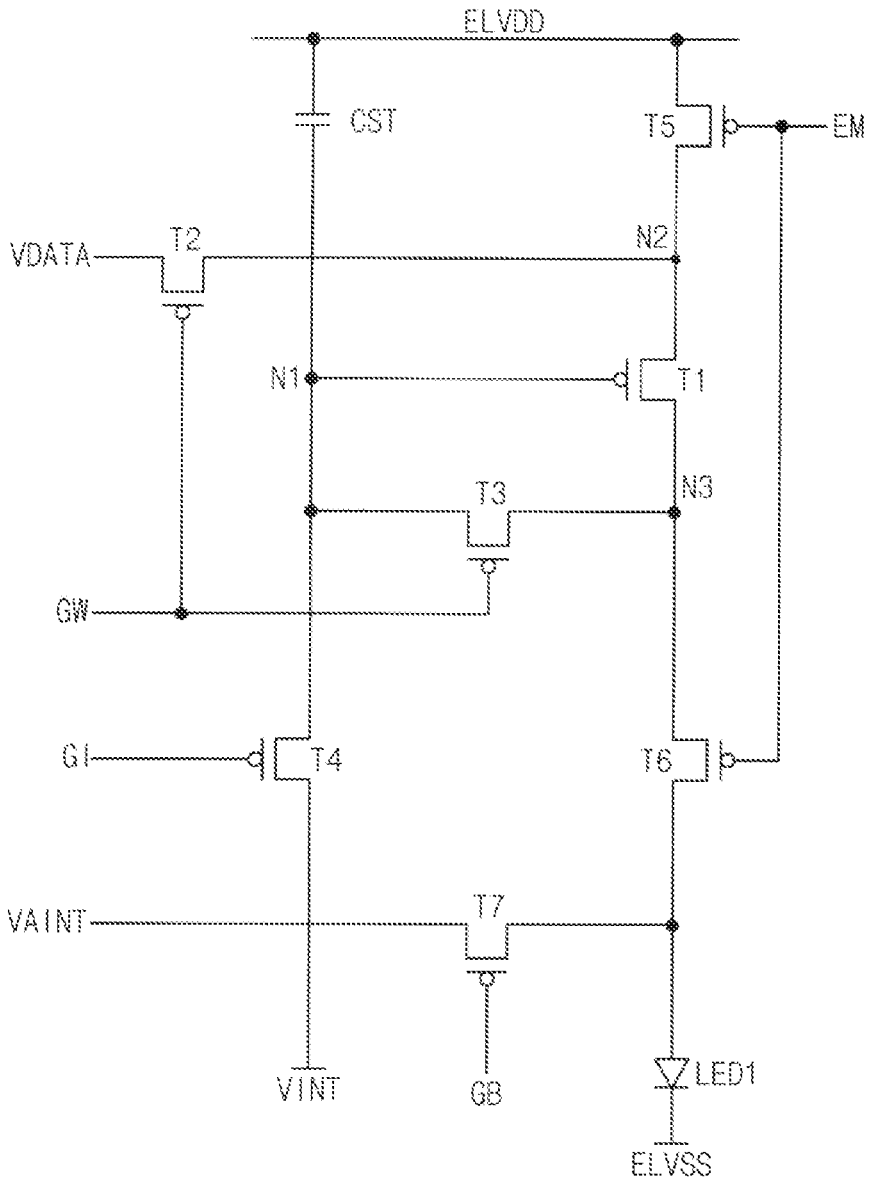
FIG. 3 is a circuit diagram of a first pixel circuit included in the display panel of FIG. 2.

FIG. 3 is a circuit diagram of a first pixel circuit included in the display panel of FIG. 2.

Referring to FIG. 2 and FIG. 3, each of the first pixel circuits PC1 disposed in the first display area DA1 may include at least one transistor and at least one capacitor to generate the driving current.

In an embodiment, each of the first pixel circuits PC1 may include a first transistor T1, a second transistor T2, a third transistor T3, a fourth transistor T4, a fifth transistor T5, a sixth transistor T6, a seventh transistor T7, and a storage capacitor CST. However, the present invention is not limited thereto. For example, each of the first pixel circuits may include 2 or more transistors and/or 1 or more capacitors.

The first transistor T1 may include a gate electrode connected to a first node N1, a first electrode connected to a second node N2, and a second electrode connected to a third node N3. The first transistor T1 may generate the driving current based on a voltage difference between the first node N1 and the second node N2. The first transistor T1 may be referred to as a driving transistor.

The second transistor T2 may include a gate electrode to which a data write gate signal GW is applied, a first electrode to which a data voltage VDATA is applied, and a second electrode connected to the second node N2. The second transistor T2 may provide the data voltage VDATA to the second node N2 in response to the data write gate signal GW. The second transistor T2 may be referred to as a switching transistor.

The third transistor T3 may include a gate electrode to which the data write gate signal GW is applied, a first electrode connected to the first node N1, and a second electrode connected to the third node N3. The third transistor T3 may compensate a threshold voltage of the first transistor T1 by connecting the first node N1 and the third node N3 in response to the data write gate signal GW. The third transistor T3 may be referred to as a compensation transistor.

The fourth transistor T4 may include a gate electrode to which a gate initialization gate signal GI is applied, a first electrode to which a first initialization voltage VINT is applied, and a second electrode connected to the first node N1. The fourth transistor T4 may provide the first initialization voltage VINT to the first node N1 in response to the data initialization gate signal GI. The fourth transistor T4 may be referred to as a first initialization transistor.

The fifth transistor T5 may include a gate electrode to which an emission control signal EM is applied, a first electrode to which a first power supply voltage ELVDD is applied, and a second electrode connected to the second node N2. The first power supply voltage ELVDD may be a high power supply voltage.

The sixth transistor T6 may include a gate electrode to which the emission control signal is applied, a first electrode connected to the third node N3, and a second electrode connected to a first electrode (for example, an anode electrode) of the first light emitting element LED1.

The fifth transistor T5 and the sixth transistor T6 may provide the driving current generated by the first transistor T1 to the first electrode of the first light emitting element LED1 in response to the emission control signal EM. The fifth transistor T5 and the sixth transistor T6 may be referred to as an emission control transistor.

The seventh transistor T7 may include a gate electrode to which an emitting element initialization gate signal GB is applied, a first electrode to which a second initialization voltage VAINT is applied, and a second electrode connected to the first electrode of the first light emitting element LED1. The seventh transistor T7 may provide the second initialization voltage VAINT to the first electrode of the first light emitting element LED1 in response to the emitting element initialization gate signal GB. The seventh transistor T7 may be referred to as a second initialization transistor.

The storage capacitor CST may include a first electrode to which the first power supply voltage ELVDD is applied and a second electrode connected to the first node N1.

The first light emitting element LED1 connected to each of the first pixel circuits PC1 may include the first electrode (for example, an anode electrode) and a second electrode (for example, a cathode electrode) to which a second power supply voltage ELVSS is applied. The second power supply voltage ELVSS may be a low power supply voltage. The first light emitting element LED1 may emit light based on the driving current.

In an embodiment, the second pixel circuits PC2 may be substantially same as the first pixel circuits PC1. In another embodiment, the second pixel circuits PC2 may be different from the first pixel circuits PC1. For example, each of the second pixel circuits PC2 may include fewer transistors than each of the first pixel circuits PC1.

Figure 4:
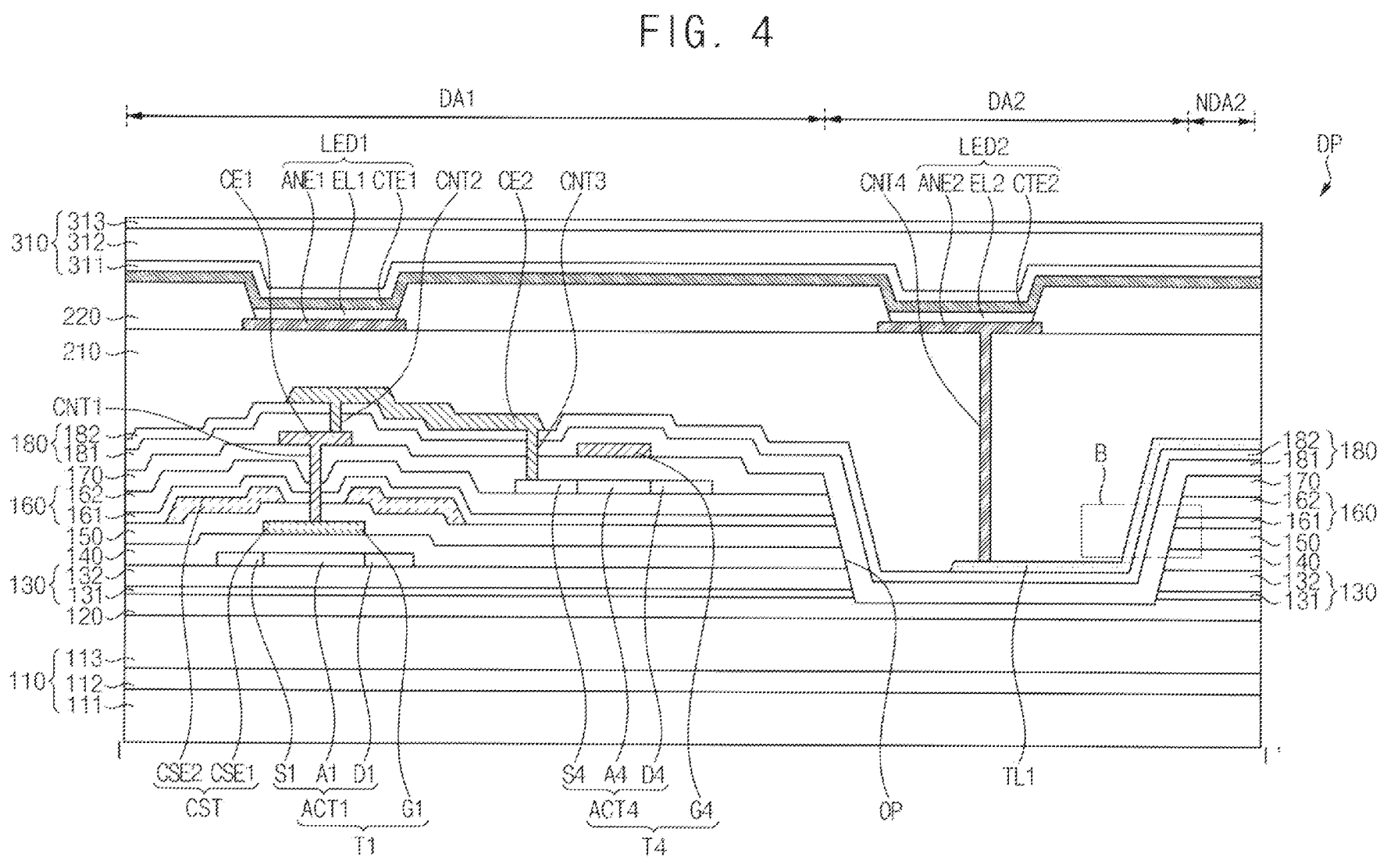

FIG. 4 is a cross-sectional view taken along a line I-I of FIG. 2.

Referring to FIG. 2, FIG. 3, and FIG. 4, in an embodiment, the display panel DP may include a substrate 110, a barrier layer 120, a buffer layer 130, the first transistor T1, a first gate insulation layer 140, a storage capacitor CST, a second gate insulation layer 150, a first interlayer insulation layer 160, the fourth transistor T4, a third gate insulation layer 170, a first connection electrode CE1, a second interlayer insulation layer 180, a second connection electrode CE2, the transparent wire TL1, a via insulation layer 210, the first light emitting element LED1, the second light emitting element LED2, a pixel defining layer 220, and an encapsulation layer 310.

The substrate 110 may be a flexible and insulating substrate. In an embodiment, the substrate 110 may have a multilayer structure including a first organic layer 111, an inorganic layer 112, and a second organic layer 113.

Each of the first organic layer 111 and the second organic layer 113 may include an organic insulation material. For example, each of the first organic layer 111 and the second organic layer 113 may include polyimide.

The inorganic layer 112 may be disposed between the first organic layer 111 and the second organic layer 113. The inorganic layer 112 may include an inorganic insulation material such as a silicon compound or a metal oxide.

The barrier layer 120 may be disposed on the substrate 110. The barrier layer 120 may be disposed on the second organic layer 113. The barrier layer 120 may include an inorganic insulation material. For example, the barrier layer 120 may include a silicon oxide.

The buffer layer 130 may be disposed on the barrier layer 120. The buffer layer 130 may include an inorganic insulation material. In an embodiment, the buffer layer 130 may include a first layer 131 including a silicon nitride and a second layer 132 disposed on the first layer 131 and including a silicon oxide. In an embodiment, a thickness of the first layer 131 may be smaller than a thickness of the second layer 132.

The active layer ACT1 may be disposed on the buffer layer 130 in the first display area DA1. The active layer ACT1 may include an oxide semiconductor, a silicon semiconductor, an organic semiconductor, etc. For example, the oxide semiconductor may include at least one oxide of indium, gallium, tin, zirconium, vanadium, hafnium, cadmium, germanium, chromium, titanium, and zinc, but the present invention is not limited thereto. The silicon semiconductor may include amorphous silicon, polycrystalline silicon, etc. The active layer ACT1 may include a first area S1, a second area D1, and a channel area A1 disposed between the first area S1 and the second area D1.

The first gate insulation layer 140 may be disposed on the active layer ACT1. The first gate insulation layer 140 may cover the active layer 140 on the buffer layer 130. The first gate insulation layer 140 may include an inorganic insulation material. For example, the first gate insulation layer 140 may include a silicon oxide.

The gate electrode G1 may be disposed on the first gate insulation layer 140 in the first display area DA1. The gate electrode G1 may overlap the channel area A1 of the active layer ACT1. The gate electrode G1 may include a conductive material such as a metal, an alloy, a conductive metal nitride, a conductive metal oxide, a transparent conductive material, etc. For example, the gate electrode G1 may include a metal such as molybdenum, copper, aluminum, titanium, etc. The active layer ACT1 and the gate electrode G1 may form the first transistor T1. Also, the gate electrode G1 may be a lower electrode CSE1 of the storage capacitor CST.

The second gate insulation layer 150 may be disposed on the gate electrode G1. The second gate insulation layer 150 may cover the gate electrode G1 on the first gate insulation layer 140. The second gate insulation layer 150 may include an inorganic insulation material. For example, the second gate insulation layer 150 may include a silicon nitride.

An upper electrode CSE2 may be disposed on the second gate insulation layer 150 in the first display area DA1. The upper electrode CSE2 may overlap the lower electrode CSE1. The upper electrode CSE2 may define an opening exposing at least a portion of the lower electrode CSE1. The lower electrode CSE1 and the upper electrode CSE2 may form the storage capacitor.

The first interlayer insulation layer 160 may be disposed on the upper electrode CSE2. The first interlayer insulation layer 160 may cover the upper electrode CSE2 on the second gate insulation layer 150. The first interlayer insulation layer 160 may include an inorganic insulation layer. In an embodiment, the first interlayer insulation layer 160 may include a first layer 161 including a silicon nitride and a second layer 162 disposed on the first layer 161 and including a silicon oxide. In an embodiment, a thickness of the first layer 161 may be smaller than a thickness of the second layer 162.

The active layer ACT4 may be disposed on the first interlayer insulation layer 160 in the first display area DA1. The active layer ACT4 may include an oxide semiconductor, a silicon semiconductor, an organic semiconductor, etc. The active layer ACT4 may include a first area S4, a second area D4, and a channel area A4 disposed between the first area S4 and the second area D4.

The third gate insulation layer 170 may be disposed on the active layer ACT4. The third gate insulation layer 170 may cover the active layer ACT4 on the first interlayer insulation layer 160. The third gate insulation layer 170 may include an inorganic insulation material. For example, the third gate insulation layer 170 may include a silicon nitride.

In an embodiment, unlike shown in FIG. 4, in the first display area DA1, the third gate insulation layer 170 may have a shape corresponding to the gate electrode G4. For example, the third gate insulation layer 170 may overlap the channel area A4 of the active layer ACT4 and may not overlap the first area S4 and the second area D4 of the active layer ACT4.

In an embodiment, the barrier layer 120, the buffer layer 130, the first gate insulation layer 140, the second gate insulation layer 150, the first interlayer insulation layer 160, and the third gate insulation layer 170 may have a transmission part OP in the second display area DA2. For example, the barrier layer 120 may define a trench in the second display area DA2 and recessed downward from a top surface of the barrier layer 120. A bottom surface of the trench may be defined as a bottom surface of the transmission part OP. Each of the buffer layer 130, the first gate insulation layer 140, the second gate insulation layer 150, the first interlayer insulation layer 160, and the third gate insulation layer 170 may define a hole in the second display area DA2. Inner surfaces of the barrier layer 120, the buffer layer 130, the first gate insulation layer 140, the second gate insulation layer 150, the first interlayer insulation layer 160, and the third gate insulation layer 170 may be aligned with each other, and the inner surfaces may be defined as an inner surface of the transmission part OP.

Hereinafter, the barrier layer 120, the buffer layer 130, the first gate insulation layer 140, the second gate insulation layer 150, the first interlayer insulation layer 160, and the third gate insulation layer 170 defining the transmission part OP may be referred to as a first inorganic insulation layer.

The gate electrode G4 may be disposed on the third gate insulation layer 170 in the first display area DA1. The gate electrode G4 may overlap the channel area A4 of the active layer ACT4. The gate electrode G4 may include a conductive material. The active layer ACT4 and the gate electrode G4 may form the fourth transistor T4.

As shown in FIG. 3 and FIG. 4, the gate electrode G1 of the first transistor T1 may be electrically connected to the active layer ACT4 (for example, the first area S4 of the active layer ACT4) of the fourth transistor T4. In an embodiment, the gate electrode G1 may be electrically connected to the active layer ACT4 through the first connection electrode CE1 and the second connection electrode CE2.

The first connection electrode CE1 may be disposed on the third gate insulation layer 170 in the first display area DA1. The first connection electrode CE1 may include the same material as the gate electrode G4, and may be formed substantially simultaneously. The first connection electrode CE1 may be disposed on the same layer as the gate electrode G4 of the fourth transistor T4. When the third gate insulation layer 170 has a shape corresponding to the gate electrode G4, the first connection electrode CE1 may be disposed on the first interlayer insulation layer 160.

The first connection electrode CE1 may overlap the gate electrode G1 of the first transistor T1. The first connection electrode CE1 may be connected to the gate electrode G1 through a first contact hole CNT1 extending through the second gate insulation layer 150, the first interlayer insulation layer 160, and the third gate insulation layer 170. The first contact hole CNT1 may be disposed in the opening of the upper electrode CSE2. When the third gate insulation layer 170 has a shape corresponding to the gate electrode G4, the first contact hole CNT1 may extend through the second gate insulation layer 150 and the first interlayer insulation layer 160.

In an embodiment, the first contact hole CNT1 may be formed substantially simultaneously with the transmission part OP. For example, the first contact hole CNT1 and the transmission part OP may be formed by the same dry etching process. The dry etching process may be performed using an etching gas having a lower etch selectivity in a material (for example, Mo) included in the gate electrode G1 than a material (for example, silicon oxide and silicon nitride) included in the first inorganic insulation layer. That is, in the dry etching process, an etch rate of the gate electrode G1 may be smaller than an etch rate of the first inorganic insulation layer. In the dry etching process, portions of the third gate insulation layer 170, the first interlayer insulation layer 160, and the second gate insulation layer 150 may be removed to form the first contact hole CNT1 and a portion of the transmission part OP (see FIG. 7). Subsequently, while over-etching the first gate insulation layer 140, the buffer layer 130, and the barrier layer 120 in the second display area DA2 to form the transmission part OP (see FIG. 8), the first gate electrode G1 exposed by the contact hole CNT1 may be hardly etched. This will be described later in detail with reference to FIG. 7 and FIG. 8.

The second interlayer insulation layer 180 may be disposed on the gate electrode G4 and the first connection electrode CE1. The second interlayer insulation layer 180 may cover the gate electrode G4 and the first connection electrode CE1 on the third gate insulation layer 170. When the third gate insulation layer 170 has a shape corresponding to the gate electrode G4, the second interlayer insulation layer 180 may cover the gate electrode G4 and the first connection electrode CE1 on the first interlayer insulation layer 160. The second interlayer insulation layer 180 may include an inorganic insulation material. In an embodiment, the second interlayer insulation layer 180 may include a first layer 181 including a silicon oxide and a second layer 182 disposed on the first layer 181 and including a silicon nitride. In an embodiment, a thickness of the first layer 181 may be larger than a thickness of the second layer 182.

The second interlayer insulation layer 180 may be disposed entirely in the first display area DA1, the second display area DA2, and the non-display area NDA, and may cover the transmission part OP of the first inorganic insulation layer. In an embodiment, as shown in FIG. 4, the second interlayer insulation layer 180 may cover the inner surface and the bottom surface of the transmission part OP. The second interlayer insulation layer 180 may be formed after the transmission part OP is formed by dry etching the first inorganic insulation layer.

Hereinafter, the second interlayer insulation layer 180 covering the transmission part OP may be referred to as a second inorganic insulation layer.

The second connection electrode CE2 may be disposed on the second interlayer insulation layer 180 in the first display area DA1. The second connection electrode CE2 may overlap the first connection electrode CE1 and the first area S4 of the active layer ACT4. The second connection electrode CE2 may be connected to the first connection electrode CE1 through a second contact hole CNT2, and may be connected to the first area S4 of the active layer ACT4 through a third contact hole CNT3. Accordingly, the gate electrode G1 of the first transistor T1 may be connected to the active layer ACT4 of the fourth transistor T4 through the first connection electrode CE1 and the second connection electrode CE2.

The second connection electrode CE2 may include a conductive material. In an embodiment, the second connection electrode CE2 may have a multilayer structure including a plurality of conductive layers. For example, the second connection electrode CE2 may have a three-layer structure of Ti/Al/Ti, but the present invention is not limited thereto.

The transparent wire TL1 may overlap the transmission part OP of the first inorganic insulation layer. For example, as shown in FIG. 4, the transparent wire TL1 may overlap the inner surface, such as the inner wall, of the transmission part OP. For another example, as shown in FIG. 4, the transparent wire TL1 may cover the bottom surface of the transmission part OP. The transparent wire TL1 may extend from the second non-display area NDA2 to the second display area DA2 along a top surface of the first inorganic insulation layer, the inner surface of the transmission part OP, and the bottom surface of the transmission part OP.

Figure 5:
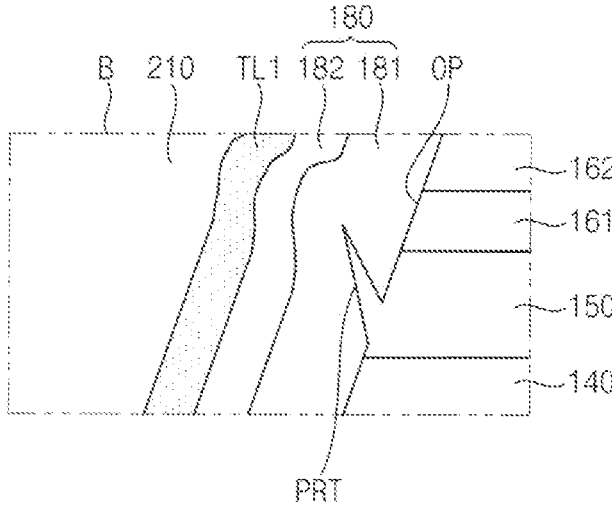
FIG. 5 is a cross-sectional view enlarging an area B of FIG. 4.
Figure 6:
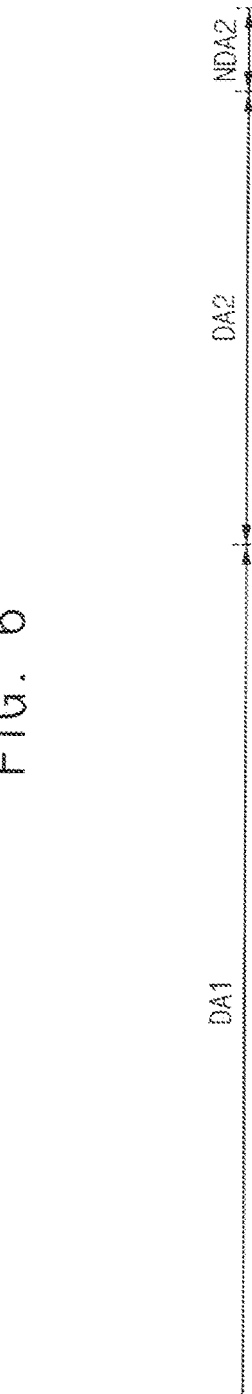
Figure 6:
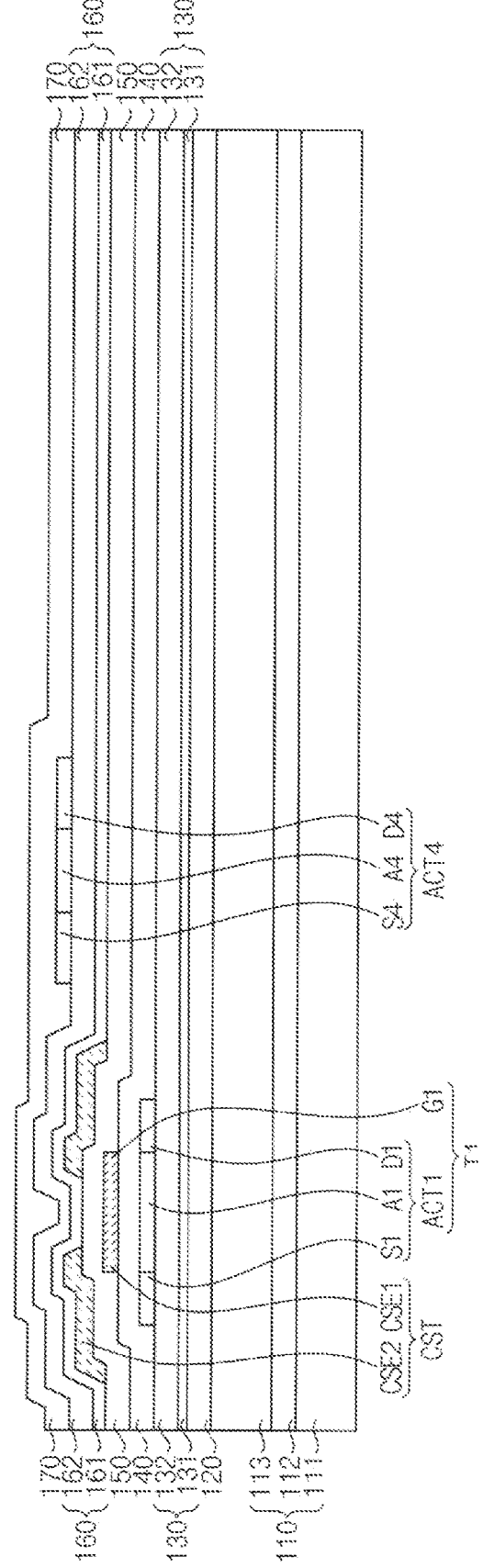

FIG. 5 is a cross-sectional view enlarging an area B of FIG. 4.

Referring to FIG. 4 and FIG. 5, in an embodiment, the inner wall of the transmission part OP may include a protrusion part PRT. For example, in a process of forming the transmission part OP by dry etching the first inorganic insulation layer, a protrusion part PRT may be formed on the inner surface of the transmission part OP according to etching condition. In this case, when the transparent wire TL1 is directly disposed on the protrusion part PRT, the transparent wire TL1 may be disconnected by the protrusion part PRT. Meanwhile, when the etching condition is adjusted so that the protrusion part PRT is not formed, a transmittance distribution between red light, green light, and blue light of the second display area DA2 may be increased.

But, according to embodiments of the present invention, the second interlayer insulation layer 180 including the first layer 181 and the second layer 182 may cover the inner surface of the transmission part OP. In this case, an area adjacent to the protrusion part PRT, a curvature of an upper surface of the second layer 182 may have a relatively gentler slope than a curvature of the inner surface of the transmission part OP. And, the transparent wire TL1 may be disposed on the upper surface of the second layer 182. Accordingly, even if the protrusion part PRT is formed on the inner surface of the transmission part OP by forming the transmission part OP by adjusting the etching condition to improve the transmittance distribution of the second display area DA2, the disconnection of the transparent wire TL1 may be prevented. Accordingly, the transmittance distribution of the second display area DA2 may be improved, and at the same time, reliability of the display panel DP may be improved.

Referring again to FIG. 2, FIG. 3, and FIG. 4, the via insulation layer 210 may be disposed on the second connection electrode CE2 and the transparent wire TL1. The via insulation layer 210 may cover the second connection electrode CE2 and the transparent wire TL1 on the second interlayer insulation layer 180. The via insulation layer 210 may include an organic insulation material. For example, the via insulation layer 210 may include polyimide. In an embodiment, the via insulation layer 210 may have a multilayer structure including a plurality of organic insulation layers.

A thickness of the via insulation layer 210 may be relatively larger than a thickness of the first inorganic insulation layer and the second inorganic insulation layer. The via insulation layer 210 may fill the transmission part OP. The via insulation layer 210 may be adjacent to the second layer 182 of the second interlayer insulation layer 180. In the second display area DA2, as the second layer 182 including silicon nitride is disposed adjacent to the via insulation layer 210, a transmittance distribution between green light and blue light of the second display area DA2 may be improved.

A first anode electrode ANE1 and a second anode electrode ANE2 may be disposed on the via insulation layer 210 in the first display area DA1 and the second display area DA2. Each of the first anode electrode ANE1 and the second anode electrode ANE2 may include a conductive material.

Not shown in FIG. 4, the first anode electrode ANE1 may be electrically connected to the sixth transistor T6 of the first pixel circuit PC1 through a contact hole (not shown) penetrating the via insulation layer 210. The second anode electrode ANE2 may be electrically connected to the transparent wire TL1 through a fourth contact hole CNT4 penetrating the via insulation layer 210. Accordingly, the second anode electrode ANE2 may be electrically connected to the second pixel circuit PC2 through the transmission wire TL.

The pixel defining layer 220 may be disposed on the first anode electrode ANE1 and the second anode electrode ANE2. The pixel defining layer 220 may include an organic insulation material. The pixel defining layer 220 may define pixel openings exposing at least a portion of the first anode electrode ANE1 and at least a portion of the second anode electrode ANE2.

A first light emitting layer EL1 and a second light emitting layer EL2 may be disposed on the first anode electrode ANE1 and the second anode electrode ANE2 exposed by the pixel openings of the pixel defining layer 220. Each of the first light emitting layer EL1 and the second light emitting layer EL2 may include at least one of an organic light emitting material and quantum dot.

In an embodiment, the organic light emitting material may include a low molecular weight organic compound or a high molecular weight organic compound. Examples of the low molecular weight organic compound may include copper phthalocyanine, diphenylbenzidine (N,N'-diphenylbenzidine), tris-(8-hydroxyquinoline)aluminum, etc. Examples of the high molecular weight organic compound may include polyethylene dioxythiophene (poly (3,4-ethylenedioxythiophene), polyaniline, polyphenylenevinylene, polyfluorene, etc. These compounds may be used alone or in combination with each other.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including the core and a shell surrounding the core. The shell may serve as a protective layer for maintaining semiconductor properties by preventing chemical modification of the core and as a charging layer for imparting electrophoretic properties to the quantum dot.

In an embodiment, functional layers, such as a hole injection layer, a hole transport layer, an electron transport layer, an electron injection layer, may be disposed on and/or under the first emitting layer EL1 and the second emitting layer EL2. In an embodiment, the functional layers may be further disposed on the pixel defining layer 220.

A first cathode electrode CTE1 and a second cathode electrode CTE2 may be disposed on the first emitting layer EL1 and the second emitting layer EL2. The first cathode electrode CTE1 and the second cathode electrode CTE2 may include a conductive material. In an embodiment, the first cathode electrode CTE1 and the second cathode electrode CTE2 may transmit light. In an embodiment, the first cathode electrode CTE1 and the second cathode electrode CTE2 may be integrally formed and may also be disposed on the pixel defining layer 220.

The first anode electrode ANE1, the first emitting layer EL1, and the first cathode electrode CTE1 may form the first emitting element LED1. The first emitting element LED1 may be disposed on the via insulation layer 210 in the first display area DA1. The second anode electrode ANE2, the second emitting layer EL2, and the second cathode electrode CTE2 may form the second emitting element LED2. The second emitting element LED2 may be disposed on the via insulation layer 210 in the second display area DA2.

The encapsulation layer 310 may be disposed on the first cathode electrode CTE1 and the second cathode electrode CTE2. The encapsulation layer may include at least one inorganic encapsulation layer and at least one organic encapsulation layer. In an embodiment, the encapsulation layer 310 may include a first inorganic encapsulation layer 311 disposed on the first cathode electrode CTE1 and the second cathode electrode CTE2, an organic encapsulation layer 312 disposed on the first inorganic encapsulation layer 311, and a second inorganic encapsulation layer 313 disposed on the organic encapsulation layer 312. The encapsulation layer 310 may cover the first light emitting element LED1 and the second light emitting element LED2.

According to embodiments, the first inorganic insulation layer disposed on the substrate 110 may define the transmission part OP corresponding to the second display area DA2. The second inorganic insulation layer disposed on the first inorganic insulation layer may cover the inner surface and the bottom surface of the transmission part OP. The transparent wire TL1 in the second display area DA2 may be disposed on the second inorganic insulation layer. Accordingly, even if the protrusion part PRT is formed on the inner surface of the transmission part OP by forming the transmission part OP by adjusting the etching condition to improve the transmittance distribution of the second display area DA2, the disconnection of the transparent wire TL1 may be prevented. Accordingly, the transmittance distribution of the second display area DA2 may be improved, and at the same time, reliability of the display panel DP may be improved.

According to embodiments, the second inorganic insulation layer may include silicon nitride. As the second inorganic insulation layer including silicon nitride is disposed adjacent to the via insulation layer 210 in the second display area DA2, the transmittance distribution between green light and blue light of the second display area DA2 may be improved.

FIG. 6, FIG. 7, FIG. 8, FIG. 9, FIG. 10, FIG. 11, and FIG. 12 are cross-sectional views illustrating a method of manufacturing a display panel of FIG. 4. Hereinafter, repeated descriptions will be omitted or simplified.

Referring to FIG. 2, FIG. 3, FIG. 4, and FIG. 6, the first pixel circuit PC1, the second pixel circuit PC2, and the first inorganic insulation layer may be formed on the substrate 110. The first pixel circuit PC1 may be formed in the first display area DA1. The first pixel circuit PC1 may include the first transistor T1, the second transistor T2, the third transistor T3, the fourth transistor T4, the fifth transistor T5, the sixth transistor T6, the seventh transistor T7, and the storage capacitor CST. The second pixel circuit PC2 may be formed in the first non-display area NDA1.

The barrier layer 120 may be formed by depositing an inorganic insulation material on the substrate 110. In an embodiment, the barrier layer 120 may include silicon nitride. In an embodiment, the barrier layer 120 may be entirely formed in the first display area DA1, the second display area DA2, and the non-display area NDA on the substrate 110.

The buffer layer 130 may be formed by depositing an inorganic insulation material on the barrier layer 120. In an embodiment, the buffer layer 130 may be entirely formed in the first display area DA1, the second display area DA2, and the non-display area NDA on the barrier layer 120.

In an embodiment, the buffer layer 130 may include the first layer 131 and the second layer 132 disposed on the first layer 131. The buffer layer 130 may be formed by forming the first layer 131 including silicon nitride on the barrier layer 120, and forming the second layer 132 including silicon oxide on the first layer 131.

The active layer ACT1 may be formed on the buffer layer 130 in the first display area DA1. The active layer ACT1 may be formed by forming a first semiconductor material layer on the buffer layer 130, and patterning the first semiconductor material layer.

The first gate insulation layer 140 may be formed by depositing an inorganic insulation material on the active layer ACT1. In an embodiment, the first gate insulation layer 140 may include silicon oxide. The first gate insulation layer 140 may cover the active layer ACT1 on the buffer layer 130. In an embodiment, the first gate insulation layer 140 may be entirely formed in the first display area DA1, the second display area DA2, and the non-display area NDA on the buffer layer 130.

The gate electrode G1 may be formed on the first gate insulation layer 140 in the first display area DA1. The gate electrode G1 may be formed by depositing a conductive material on the first gate insulation layer 140, and patterning the conductive material. In an embodiment, the gate electrode G1 may include Mo. The gate electrode G1 may overlap the channel area A1 of the active layer ACT1.

The active layer ACT1 and the gate electrode G1 may form the first transistor T1. Also, the gate electrode G1 may be the lower electrode CSE1 of the storage capacitor CST.

The second gate insulation layer 150 may be formed by depositing an inorganic insulation material on the gate electrode G1. In an embodiment, the second gate insulation layer 150 may include silicon nitride. The second gate insulation layer 150 may cover the gate electrode G1 on the first gate insulation layer 140. In an embodiment, the second gate insulation layer 150 may be entirely formed in the first display area DA1, the second display area DA2, and the non-display area NDA on the first gate insulation layer 140.

The upper electrode CSE2 may be formed on the second gate insulation layer 150 in the first display area DA1. The upper electrode CSE2 may be formed by depositing a conductive material on the second gate insulation layer 150, and patterning the conductive material. In an embodiment, the upper electrode CSE2 may include Mo. The upper electrode CSE2 may define the opening overlapping the lower electrode CSE1 and exposing at least a portion of the lower electrode CSE1. The lower electrode CSE1 and the upper electrode CSE2 may form the storage capacitor CST.

The first interlayer insulation layer 160 may be formed by depositing an inorganic insulation material on the upper electrode CSE2. The first interlayer insulation layer 160 may cover the upper electrode CSE2 on the second gate insulation layer 150. In an embodiment, the first interlayer insulation layer 160 may be entirely formed in the first display area DA1, the second display area DA2, and the non-display area NDA on the second gate insulation layer 150.

In an embodiment, the first interlayer insulation layer 160 may include the first layer 161 and the second layer 162 disposed on the first layer 161. The first interlayer insulation layer 160 may be formed by forming the first layer 161 including silicon nitride on the second gate insulation layer 150, and forming the second layer 162 including silicon oxide on the first layer 161.

The active layer ACT2 may be formed on the first interlayer insulation layer 160 in the first display area DA1. The active layer ACT2 may be formed by forming a second semiconductor material layer on the first interlayer insulation layer 160, and patterning the second semiconductor material layer.

The third gate insulation layer 170 may be formed by depositing an inorganic insulation material on the active layer ACT2. In an embodiment, the third gate insulation layer 170 may include silicon nitride. The third gate insulation layer 170 may cover the active layer ACT2 on the first interlayer insulation layer 160. In an embodiment, the third gate insulation layer 170 may be entirely formed in the first display area DA1, the second display area DA2, and the non-display area NDA on the first interlayer insulation layer 160.

The barrier layer 120, the buffer layer 130, the first gate insulation layer 140, the second gate insulation layer 150, the first interlayer insulation layer 160, and the third gate insulation layer 170 may be referred to as the first inorganic insulation layer.

Figure 7:
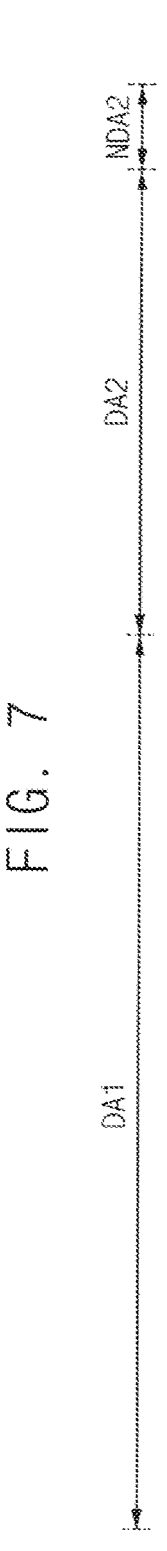
Figure 7:
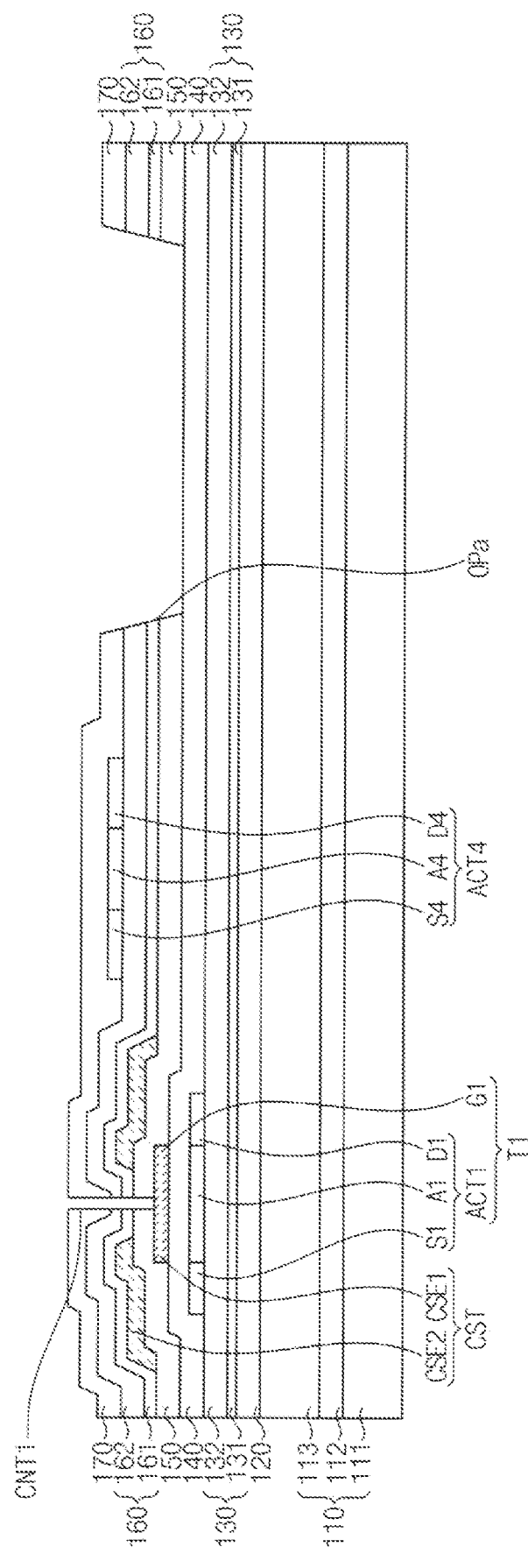
Figure 8:
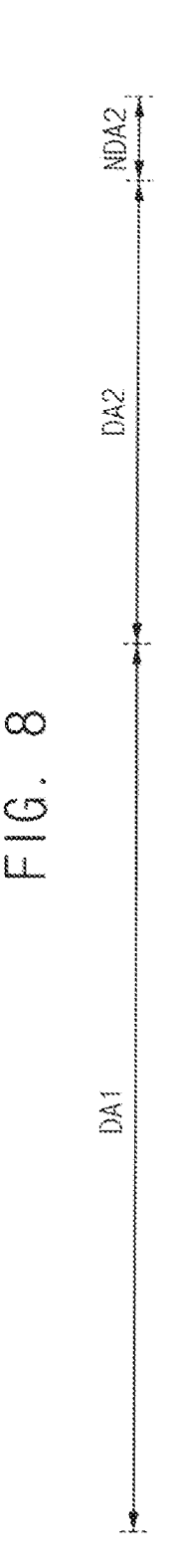
Figure 8:
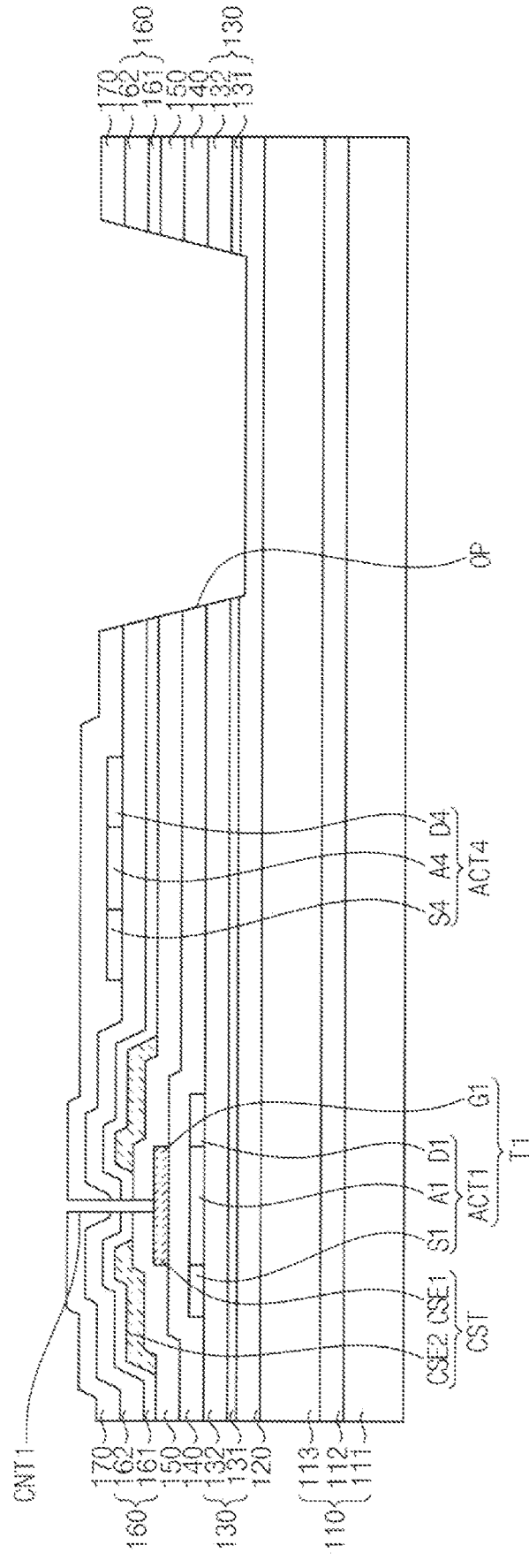

Referring to FIG. 7 and FIG. 8, the first contact hole CNT1 and the transmission part OP may be formed by removing a portion of the first inorganic insulation layer. The first contact hole CNT1 may be formed in the first display area DA1, and the transmission part OP may be formed in the second display area DA2. In an embodiment, the first contact hole CNT1 and the transmission part OP may be substantially simultaneously formed. For example, the first contact hole CNT1 and the transmission part OP may be formed by the same dry etching process.

A photoresist layer may be formed on the first inorganic insulation layer, and a photoresist pattern (not shown) may be formed by exposing and developing the photoresist layer. The photoresist pattern may define a first opening overlapping the opening of the upper electrode CSE2 and a second opening corresponding to the second display area DA2.

The first inorganic insulation layer may be dry etched by using the photoresist pattern as an etching mask. Accordingly, as shown in FIG. 7, portions of the third gate insulation layer 170, the first interlayer insulation layer 160, and the second gate insulation layer 150 may be removed to form the first contact hole CNT1 and a portion OPa of the transmission part OP.

Subsequently, as shown in FIG. 8, the transmission part OP may be formed by over-etching the first gate insulation layer 140, the buffer layer 130, and the barrier layer 120 in the second display area DA2. In an embodiment, the dry etching process including the over-etching may be performed using an etching gas having a lower etch selectivity in a material (for example, Mo) included in the gate electrode G1 than a material (for example, silicon oxide and silicon nitride) included in the first inorganic insulation layer. That is, in the dry etching process, an etch rate of the gate electrode G1 may be smaller than an etch rate of the first inorganic insulation layer (for example, an etch rate of each of the barrier layer 120, the buffer layer 130, the first gate insulation layer 140, the second gate insulation layer 150, the first interlayer insulation layer 160, and the third gate insulation layer 170). Accordingly, while over-etching the first gate insulation layer 140, the buffer layer 130, and the barrier layer 120 in the second display area DA2, the first gate electrode G1 exposed by the contact hole CNT1 may be hardly etched.

According to embodiments, the transmission part OP corresponding to the second display area DA2 may be formed substantially simultaneously with the first contact hole CNT1. Accordingly, since an additional patterning process for forming the transmission part OP is not required, manufacturing time and manufacturing cost of the display panel DP may be reduced.

In an embodiment, the dry etching process including the over-etching may be performed by adjusting etching condition to improve a transmittance distribution of the second display area DA2. In this case, as shown in FIG. 5, the protrusion part PRT having a fence shape may be formed on the inner surface of the transmission part OP.

Figure 9:
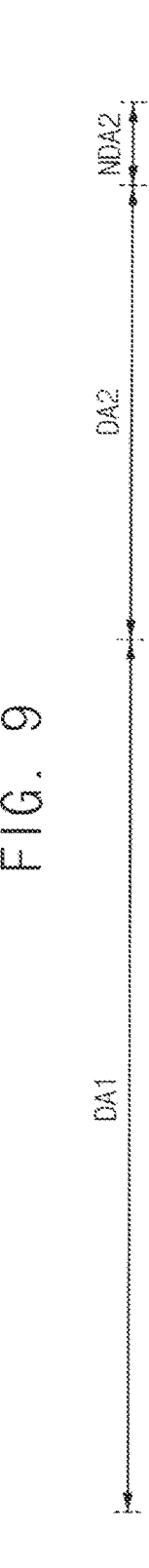

Referring to FIG. 9, the gate electrode G4 and the first connection electrode CE1 may be formed on the third gate insulation layer 170 in the first display area DA1. In an embodiment, the gate electrode G4 and the first connection electrode CE1 may be substantially simultaneously formed.

The gate electrode G4 and the first connection electrode CE1 may be formed by depositing a conductive material on the third gate insulation layer 170, and patterning the conductive material. In an embodiment, the gate electrode G4 and the first connection electrode CE1 may include Mo. The gate electrode G4 may overlap the channel area A4 of the active layer ACT4. The active layer ACT4 and the gate electrode G4 may form the fourth transistor Tr. The first connection electrode CE1 may overlap the gate electrode G1 of the first transistor T1. The first connection electrode CE1 may be electrically connected to the gate electrode G1 through the first contact hole CNT1.

Subsequently, the second interlayer insulation layer 180 may be formed by depositing an inorganic insulation material on the gate electrode G4 and the first connection electrode CE1. The second interlayer insulation 180 may cover the gate electrode G4 and the first connection electrode CE1 on the third gate insulation layer 170. The second interlayer insulation layer 180 may be entirely formed in the first display area DA1, the second display area DA2, and the non-display area NDA on the third gate insulation layer 170. That is, the second interlayer insulation layer 180 may entirely cover the inner surface and the bottom surface of the transmission part OP in the second display area DA2.

In an embodiment, the second interlayer insulation layer 180 may include the first layer 181 and the second layer 182 disposed on the first layer 181. The second interlayer insulation layer 180 may be formed by forming the first layer 181 including silicon oxide on the third gate insulation layer 170, and forming the second layer 182 including silicon nitride on the first layer 181. Accordingly, the second interlayer insulation layer 180 may substantially cover the protrusion part PRT formed on the inner surface of the transmission part OP.

The second interlayer insulation layer 180 may be referred to as the second inorganic insulation layer. The second inorganic insulation layer may be formed on the first inorganic insulation layer, and may entirely cover the inner surface and the bottom surface of the transmission part OP.

Figure 10:
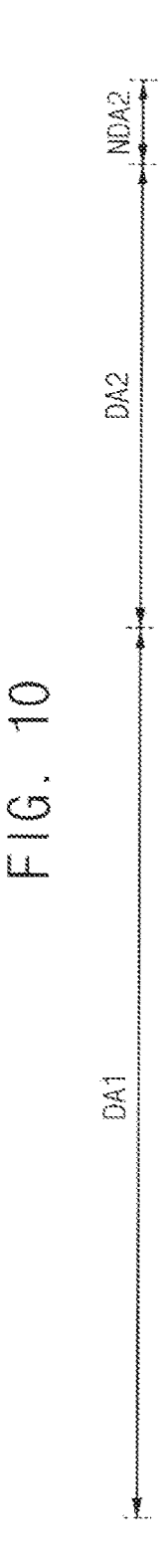

Referring to FIG. 10, the second connection electrode CE2 may be formed on the second interlayer insulation layer 180 in the first display area DA1. Forming the second connection electrode CE2 may include forming the second contact hole CNT2 and the third contact hole CNT3 by removing a portion of each of the second interlayer insulation layer 180 and the third gate insulation layer 170, depositing a conductive material on the second interlayer insulation layer 180, and patterning the conductive material. In an embodiment, the second connection electrode CE2 may have three-layer structure of Ti/Al/Ti. The second connection electrode CE2 may be electrically connected to the first connection electrode CE1 through the second contact hole CNT2, and may be electrically connected to the active layer ACT4 through the third contact hole CNT3.

Figure 11:
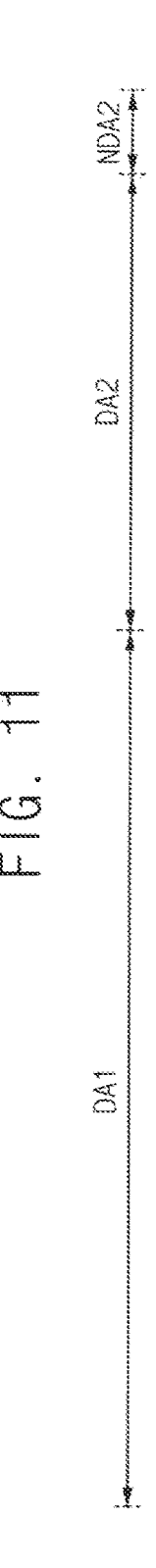

Referring to FIG. 11, the transparent wire TL1 may be formed on the second interlayer insulation layer 180. Forming the transparent wire TL1 may include forming a transparent conductive layer by depositing a transparent conductive material (for example, ITO) on the second interlayer insulation layer 180 and the second connection electrode CE2, and patterning the transparent conductive layer.

In an embodiment, the transparent conductive layer may be wet-etched using an etchant having a lower etch selectivity in a material (for example, Ti and Al) included in the second connection electrode CE2 than a material (for example, ITO) included in the transparent conductive layer. That is, in the wet etching process, an etch rate of the second connection electrode CE2 may be slower than an etch rate of the transparent conductive layer. Accordingly, in the wet etching process, the second connection electrode CE2 may be hardly etched.

The transparent wire TL1 may cover the inner surface of the transmission part OP. In an embodiment, the transparent wire TL1 may cover the inner wall and at least part of the bottom surface of the transmission part OP. For example, the transparent wire TL1 may extend from the second non-display area NDA2 to the second display area DA2 along a top surface of the first inorganic insulation layer, the inner surface of the transmission part OP, and the bottom surface of the transmission part OP.

Subsequently, the via insulation layer 210 may be formed by depositing an organic insulation material on the second connection electrode CE2 and the transparent wire TL1. In an embodiment, the via insulation layer 210 may include polyimide. The via insulation layer 210 may cover the second connection electrode CE2 and the transparent wire TL1 on the second interlayer insulation layer 180.

A thickness of the via insulation layer 210 may be larger than a thickness of the first inorganic insulation layer and a thickness of the second inorganic insulation layer. The via insulation layer 210 may fill the transmission part OP. The via insulation layer 210 may be adjacent to the second layer 182 of the second interlayer insulation layer 180. As the second layer 182 including silicon nitride is disposed adjacent to the via insulation layer 210 in the second display area DA2, the transmittance distribution between green light and blue light of the second display area DA2 may be improved.

Referring to FIG. 12, the first light emitting element LED1 and the second light emitting element LED2 may be formed in the first display area DA1 and the second display area DA2, respectively, on the via insulation layer 210. The second light emitting element LED2 may be electrically connected to the transparent wire TL1 through the fourth contact hole CNT4 that extends through the via insulation layer 210. Subsequently, the encapsulation layer 310 covering the first light emitting element LED1 and the second light emitting element LED2 may be formed.

FIG. 13 is a cross-sectional view illustrating a display panel according to another embodiment. A display panel DP′ described with reference to FIG. 13 may be substantially the same as or similar to the display panel DP described with reference to FIG. 4 except for a third gate insulation layer 170′ and a transmitting part OP′. Accordingly, repeated descriptions will be omitted or simplified.

Referring to FIG. 13, in an embodiment, the barrier layer 120, the buffer layer 130, the first gate insulation layer 140, the second gate insulation layer 150, and the first interlayer insulation layer 160 may define the transmission part OP′ in the second display area DA2. For example, the barrier layer 120 may define a trench corresponding to the second display area DA2 and recessed downward from a top surface of the barrier layer 120. A bottom surface of the trench may be defined as a bottom surface of the transmission part OP′. Each of the buffer layer 130, the first gate insulation layer 140, the second gate insulation layer 150, and the first interlayer insulation layer 160 may define a hole corresponding to the second display area DA2. Inner surfaces of the barrier layer 120, the buffer layer 130, the first gate insulation layer 140, the second gate insulation layer 150, and the first interlayer insulation layer 160 may be aligned with each other, and the inner surfaces may be defined as an inner surface of the transmission part OP.

Hereinafter, the barrier layer 120, the buffer layer 130, the first gate insulation layer 140, the second gate insulation layer 150, and the first interlayer insulation layer 160 defining the transmission part OP′ may be referred to as a first inorganic insulation layer.

The third gate insulation layer 170′ and the second interlayer insulation layer 180 may be entirely disposed in the first display area DA1, the second display area DA2, and the non-display area NDA, and may cover the transmission part OP of the first inorganic insulation layer. In an embodiment, in the first display area DA1, the third gate insulation layer 170′ may have a shape corresponding to the gate electrode G4 (for example, a shape of the third gate insulation layer 170′ may be substantially same as a shape of the gate electrode G4, and the third gate insulation layer 170′ may perfectly overlap the gate electrode G4, in a plan view).

In an embodiment, as shown in FIG. 13, the third gate insulation layer 170′ and the second interlayer insulation layer 180 may entirely cover the inner surface and the bottom surface of the transmission part OP″.

Hereinafter, the third gate insulation layer 170′ and the second interlayer insulation layer 180 covering the transmission part OP′ may be referred to as a second inorganic insulation layer.

After forming the first inorganic insulation layer including the barrier layer 120, the buffer layer 130, the first gate insulation layer 140, the second gate insulation layer 150, and the first interlayer insulation layer 160 disposed on the substrate 110, the transmission part OP′ corresponding to the second display area DA2 may be formed by removing a portion of the first inorganic insulation layer. Subsequently, the second inorganic insulation layer including the third gate insulation layer 170' and the second interlayer insulation layer 180 may be formed on the first inorganic insulation layer. Accordingly, the second inorganic insulation layer may entirely cover the inner surface and the bottom surface of the transmission part OP".

The second interlayer insulation layer 180 including the first layer 181 and the second layer 182 and the third gate insulation layer 170' may cover the inner surface of the transmission part OP'. Accordingly, an area adjacent to the protrusion part PRT, the curvature of the upper surface of the second layer 182 may be a further gentle slope (see FIG. 5). The transparent wire TL1 may be disposed on the upper surface of the second layer 182. Accordingly, even if the protrusion part PRT is formed on the inner surface of the transmission part OP by forming the transmission part OP' by adjusting the etching condition to improve the transmittance distribution of the second display area DA2, the disconnection of the transparent wire TL1 may be prevented. Accordingly, the transmittance distribution of the second display area DA2 may be improved, and at the same time, reliability of the display panel DP may be improved.

Figure 14:
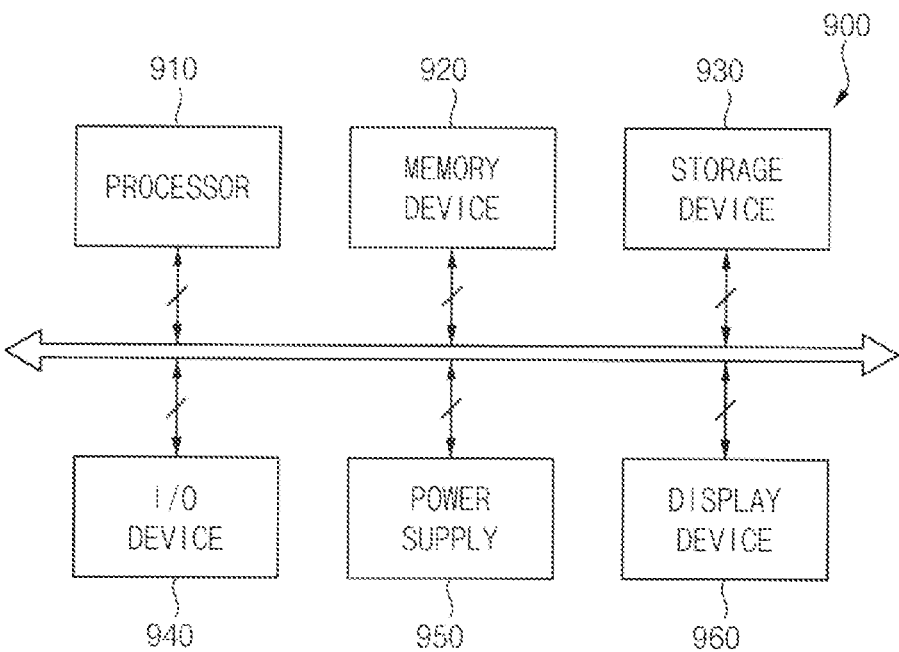
FIG. 14 is a block diagram illustrating an electronic device according to an embodiment.

FIG. 14 is a block diagram illustrating an electronic device according to an embodiment.

Referring to FIG. 14, in an embodiment, an electronic device 900 may include a processor 910, a memory device 920, a storage device 930, an input/output device 940, a power supply 950, and a display panel 960. In this case, the display panel 960 may correspond to the display panel according to an embodiment described with reference to FIG. 4 or FIG. 13. The electronic device 900 may further include a plurality of ports for communicating with a video card, a sound card, a memory card, a universal serial bus ("USB") device, or the like. In an embodiment, the electronic device 900 may be implemented as a television. In another embodiment, the electronic device 900 may be implemented as a smart phone. However, embodiments are not limited thereto, in another embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. In an embodiment, the processor 910 may be coupled to an extended bus such as a peripheral component interconnection ("PCI") bus.

The memory device 920 may store data for operations of the electronic device DD. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like. In an embodiment, the I/O device 940 may include an input device such as a keyboard, a keypad, a mouse device, a touchpad, a touch-screen, or the like, and an output device such as a printer, a speaker, or the like.

The power supply 950 may provide power for operations of the electronic device DD. The display device 960 may be coupled to other components via the buses or other communication links. In an embodiment, the display device 960 may be included in the I/O device 940.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
a substrate comprising a first display area and a second display area adjacent to the first display area;
a first inorganic insulation layer disposed on the substrate and defining a transmission part corresponding to the second display area;
a second inorganic insulation layer disposed on the first inorganic insulation layer, and covering an inner surface and a bottom surface of the transmission part;
a transparent wire disposed on the second inorganic insulation layer in the second display area, and comprising a transparent conductive material;
a via insulation layer disposed on the second inorganic insulation layer and the transparent wire, and comprising an organic material;
a first light emitting element disposed on the via insulation layer in the first display area;
a second light emitting element disposed on the via insulation layer in the second display area, and electrically connected to the transparent wire; and
an encapsulation layer covering the first light emitting element and the second light emitting element.

2. The display panel of claim 1, wherein the transparent wire covers the inner surface of the transmission part.

3. The display panel of claim 2, wherein the inner surface of the transmission part comprises a protrusion part, and the second inorganic insulation layer covers the protrusion part.

4. The display panel of claim 1, wherein the second inorganic insulation layer comprises silicon nitride.

5. The display panel of claim 1, wherein the via insulation layer fills the transmission part.

6. The display panel of claim 1, wherein the first display area surrounds at least a portion of the second display area, and
a transmittance of the second display area is larger than a transmittance of the first display area.

7. The display panel of claim 1, further comprising:
a first pixel circuit electrically connected to the first light emitting element; and
a second pixel circuit electrically connected to the second light emitting element through the transparent wire.

8. The display panel of claim 7, wherein the first pixel circuit comprises:
a driving transistor comprising a first active layer and a first gate electrode disposed on the first active layer;

a capacitor comprising the first gate electrode and an upper electrode disposed on the first gate electrode; and an initialization transistor comprising a second active layer disposed on the upper electrode and electrically connected to the first gate electrode, and a second gate electrode disposed on the second active layer.

9. The display panel of claim 8, further comprising:

a barrier layer disposed on the substrate;

a buffer layer disposed on the barrier layer;

a first gate insulation layer covering the first active layer on the buffer layer;

a second gate insulation layer covering the first gate electrode on the first gate insulation layer;

a first interlayer insulation layer covering the upper electrode on the second gate insulation layer;

a third gate insulation layer covering the second active layer on the first interlayer insulation layer; and a second interlayer insulation layer covering the second gate electrode on the third gate insulation layer, wherein the second inorganic insulation layer comprises the second interlayer insulation layer.

10. The display panel of claim 9, wherein the second inorganic insulation layer comprises a first layer comprising silicon oxide and a second layer comprising a silicon nitride.

11. The display panel of claim 9, wherein the first inorganic insulation layer comprises the barrier layer, the buffer layer, the first gate insulation layer, the second gate insulation layer, the first interlayer insulation layer, and the third gate insulation layer.

12. The display panel of claim 9, wherein the first inorganic insulation layer comprises the barrier layer, the buffer layer, the first gate insulation layer, the second gate insulation layer, and the first interlayer insulation layer, and the second inorganic insulation layer further comprises the third gate insulation layer.

13. The display panel of claim 9, wherein the barrier layer defines a trench in the second display area and recessed downward from a top surface of the barrier layer, and the bottom surface of the trench is defined as a bottom surface of the transmission part.

14. The display panel of claim 9, further comprising:

a first connection electrode disposed on the same layer as the second gate electrode, and electrically connected to the first gate electrode through a contact hole that extends to the first gate electrode; and a second connection electrode disposed on the second interlayer insulation layer, and electrically connected to each of the first connection electrode and the second active layer.

15. A display panel comprising:

a substrate comprising a first display area and a second display area adjacent to the first display area;

a first inorganic insulation layer disposed on the substrate, and defining a transmission part in the second display area;

a second inorganic insulation layer disposed on the first inorganic insulation layer, covering an inner surface and a bottom surface of the transmission part, and comprising silicon nitride;

a via insulation layer disposed on the second inorganic insulation layer, filling the transmission part, and comprising an organic material;

a first light emitting element disposed on the via insulation layer in the first display area;

a second light emitting element disposed on the via insulation layer in the second display area; and an encapsulation layer covering the first light emitting element and the second light emitting element.

16. The display panel of claim 15, further comprising:

a transparent wire disposed on the second inorganic insulation layer in the second display area, and comprising a transparent conductive material, wherein the second light emitting element is electrically connected to the transparent wire.

17. The display panel of claim 16, wherein the transparent wire covers the inner surface of the transmission part.

* * * * *